United States Patent [19]

Rinerson et al.

[11] Patent Number: 5,185,718
[45] Date of Patent: Feb. 9, 1993

[54] MEMORY ARRAY ARCHITECTURE FOR FLASH MEMORY

[75] Inventors: Darrell D. Rinerson, Cupertino; Steve K. Hsia, Saratoga; Christophe J. Chevallier, Palo Alto; Chan-Sui Pang, Sunnyvale, all of Calif.

[73] Assignee: Catalyst Semiconductor Corporation, Santa Clara, Calif.

[21] Appl. No.: 658,279

[22] Filed: Feb. 19, 1991

[51] Int. Cl.[5] .............................................. G11C 13/00
[52] U.S. Cl. .................. 365/185; 365/189.01; 365/218; 365/230.01
[58] Field of Search .................. 365/185, 218, 189.01, 365/230.01

[56] References Cited

U.S. PATENT DOCUMENTS

5,101,379 3/1992 Lin et al. .............................. 365/185

Primary Examiner—Terrell W. Fears
Attorney, Agent, or Firm—Skjerven, Morrill, MacPherson, Franklin & Friel

[57] ABSTRACT

Disclosed is a EEPROM flash memory array utilizing single transistor cells to provide read/write nonvolatile storage. The array includes a plurality of sectors, each oriented along the word line direction, and the sectors may include one or more word lines. An erase select transistor is provided for each sector and each word line includes a pass gate transistor which assists in both the programming and the erase operations.

8 Claims, 6 Drawing Sheets

MEMORY ARRAY ARCHITECTURE FOR FLASH MEMORY

BACKGROUND OF THE INVENTION

1. Field Of The Invention

This invention relates generally to high density integrated circuit memories of the electrically erasable 0 programmable read-only memory (EEPROM) type and more particularly EEPROM arrays of the flash memory type which may be either flash erased or erased on the basis of one or more sectors.

2. Description Of Related Art

Figure 1:
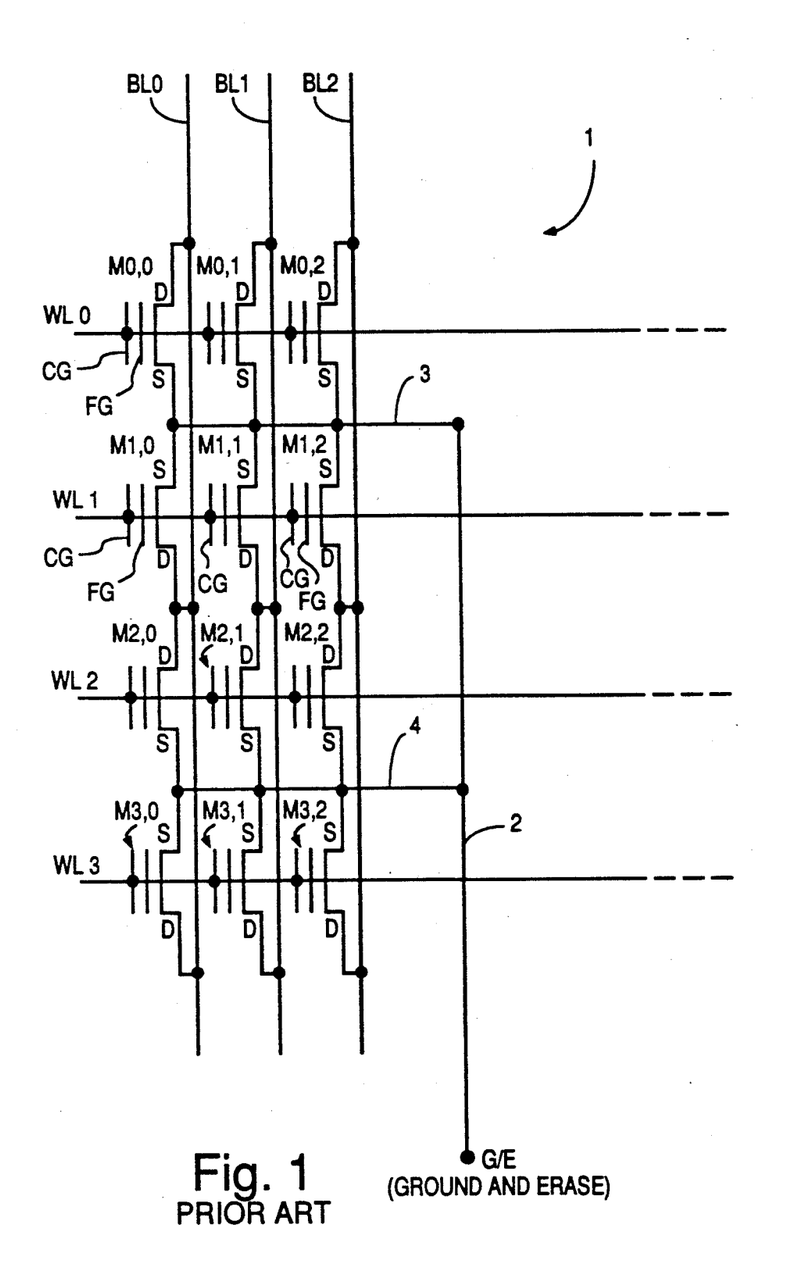
FIGS. 1 and 2 illustrate prior art flash memory array architectures.
Figure 2:
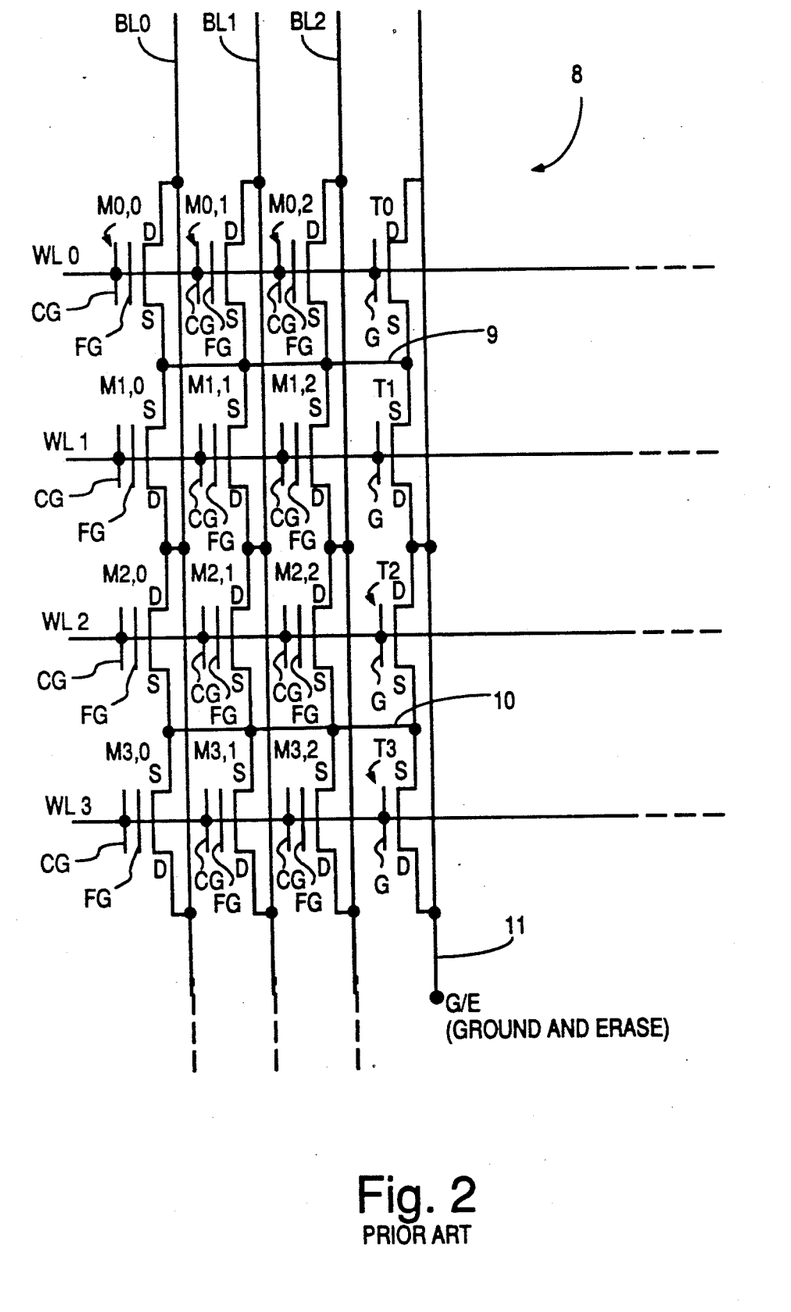

Flash memory arrays are known in the prior art and typically are comprised of an arrangement of single transistors cells which are connected together in such a way that read/write non-volatile storage is achieved. Typical flash memory arrays of the prior art are completely erased with one erase cycle, or in other embodiments erased entirely with two erase cycles. FIGS. 1 and 2, which will be described more fully hereinafter, illustrate typical prior art EEPROM flash memory array circuits.

FIG. 1 illustrates, in abbreviated schematic form, a prior art flash memory array 1 which utilizes single transistor cells at the intersection word lines and bit lines. More particularly, referring to FIG. 1 transistor M0,0 is positioned at the intersection of word line WL0 and the bit line BL0; transistor M0,1 is positioned at the intersection of word line WL0 and bit line BL1; and similarly transistor M0,2 is positioned at intersection word line of WL0 and bit line BL1. Similarly, word line WL1 includes single cell transistors at the intersection of word line word line WL1 and bit lines BL0, BL1 and BL2. It will be appreciated that the transistors are identified using the convention that the first number indicates the word line and the second number indicates the bit line (for example transistor M0, 0 is located at the intersection of word line WL0 and bit line BL0). Each of the memory cell transistors includes a control gate, indicated on the drawing by a CG, a floating gate indicated by FG, drain indicated by D and source indicated by S. As will be appreciated by reference to FIG. 1, all of the source regions are coupled together and further are coupled by line 2 to the ground and erase voltage terminal (G/E). In flash memory array 1, all of the memory cells are erased simultaneously by bringing terminal G/E to VPP (approximately 12 volts), taking the word lines to 0 volts and allowing the bit lines to float. Under these conditions, electrons on the floating gates travel through the gate oxide to the source side of the transistors via Fowler-Nordheim tunneling. A potential problem with this type of array is that the cells may become over erased (that is, have their threshold voltage educed below an acceptable level). Under those circumstances during programming the unselected, over-erased cells draw current which detracts from the programming current required to program the selected cell. Another disadvantage of an array of the type as illustrated by flash memory array 1 is that there is no ability to selectively erase portions of the array. Programming of flash memory array 1 is typically accomplished by channel hot-electron injection into the floating gate from the drain side of the transistor. To illustrate the disadvantage of over-erasure of transistor during program operation, assume that flash memory array 1 has been entirely erased and it is desirable to program transistor M0,O. To program transistor word line M0, O, terminal G/E is placed at 0 volts (0v), word line WL0 is brought to a high voltage (HV) of approximately 12-14 volts and bit line BL0 is raised to 6 to 8 volts. Under these conditions, electrons travel through the gate oxide near the drain region by channel hot-electron injection. Current also flows through source region 3 to terminal G/E during the programming process. Although not selected to be programmed, transistors M1,O, M2,0 and M3,0 if over-erased, may also slightly conduct and detract from the programming current which is required for programming transistor M0,0. Thus it will be appreciated that flash memory array such as flash memory array 1 must be carefully engineered to avoid the potential problems which may occur on programming, including the disturbance of unselected cells along the word line and bit lines. And additionally, as pointed out above, flash memory of the type illustrated by array 1 must be entirely erased and no provision is available for erasing less than the entire array.

Referring to FIG. 2, it will be appreciated that flash memory array 8 is in many respects similar to flash memory array 1 of FIG. 1. However, flash memory array 8 incorporates a pass gate transistor (which is also sometimes referred to as a select transistor) for each word line; more particularly, word line WL0 includes pass gate transistor T0, word line WLI includes pass gate transistor T1, word line WL2 includes pass gate transistor T2 and word line WL3 includes pass gate transistor T3. In flash memory array 8 the transistors associated with word lines WL0 and WLI share in common a source region, indicated by reference character 9, and the transistors associated with word lines WL2 and WL3 share in common the source region indicated by reference character 10. Unlike flash memory array 1, the source regions in flash memory array 8 are not commonly connected. It will also be appreciated by referring to FIG. 2 that the G/E terminal is connected via line 11 to the respective drains of pass gate transistors T0-T3. The source regions of pass gate transistors T0-T3 are common with the source region for the cells along the word line to which the gate of the transistor is connector. The architecture of flash memory array 8 is similar to that described in U.S. Pat. No. 4,698,787, issued Oct. 6, 1987 to Mukherjee et al., entitled "Single Transistor Electrically Programmable Memory Device and Method". The inclusion of pass gate transistors T0-T3 provides some protection from the over-erase problems encountered in flash memory array of the type illustrated in FIG. 1. With the architecture of flash memory array 8 it is possible to erase the entire array, which requires two cycles of operation, as will be described hereafter, or erase individual word lines, or erase all the even numbered word lines or all of the odd numbered word lines. However, it is not possible to erase adjacent word lines in a single erase cycle.

To assist in understanding the program and erase operations for flash memory array 8, Table 1 is provided.

TABLE 1

| | Signals for Programming and Erasing FLASH MEMORY ARRAY 8 OF FIG. 2 | |
|---|---|---|
| Lead | Erasing Transistor M1, 0 | Programming Transistor M1, 0 |
| WL0 | VPP+ | 0 volts |
| WL1 | 0 volts | VPP+ or VPP |

TABLE 1-continued

Signals for Programming and
Erasing FLASH MEMORY ARRAY 8
OF FIG. 2

| Lead | Erasing Transistor M1, 0 | Programming Transistor M1, 0 |
| --- | --- | --- |
| WL2 | VPP+ | 0 volts |
| WL3 | 0 volts | 0 volts |
| BL0 | Floating | 6-9 volts |
| BL1 | Floating | Floating |
| BL | Floating | Floating |
| G/E | VPP | 0 volts |

As will be appreciated by reference to Table 1, to erase transistor M1,0 word line WL0 is brought to VPP+ (typically 13-14 volts) which is required to turn on pass gate transistor T0. Bit line BL0 is floating and ground erase terminal G/E is brought to VPP+. Under these conditions, electrons on the floating gate of transistor M1,0 tunnel by the Fowler-Nordheim phenomenon to the source of transistor M1,0 and the transistor is erased. Other transistors along word line WL1 are similarly erased because node 9 is connected in common. It will be appreciated that erasing transistors on the word line WL1 tends to disturb the transistors on word line WL0 because during the erase process, the control gate of each of the transistors on word line WL0 are at a high voltage and similarly common source region 9 is also at a high voltage since it is coupled to terminal G/E via line 11 and pass gate transistor T0. During the erase of cells on word line WLI, pass gate transistor T0 is conducting and pass gate transistor Tl is not conducting. From the foregoing it will be appreciated that the pass gate transistor on the word line adjacent to the source side of the transistor being erased must be conducting to accomplish erasure of transistors along the word line which is selected for erasure. Similarly to the foregoing situation, to erase transistors along word line WL3, word line WL2 is brought to VPP+, appropriate voltages applied to the bit lines and the erase voltage applied to terminal G/E. Thus in order to erase flash memory array 8 entirely, two cycles of operation are required. More particularly, in the first cycle even numbered word lines are brought high to erase the cells on odd-numbered word lines, and during the second cycle odd numbered word lines are brought high to erase the cells on the even-numbered word lines. If sector erase were to be used with this architecture, accurate and careful control of the word line and G/E voltages would be required to prevent disturb on the unselected sectors. This control would be difficult to achieve in practice.

One approach that has been taken to provide flash and byte erasability for a EEPROM array is disclosed in U.S. Pat. No. 4,949,309 issued Aug. 14, 1990 to Kamesawara K. Rao entitled "EEPROM Utilizing a Single Transistor Per Cell Capable of Both Byte Erase and Flash Erase". This patent is commonly assigned to the assignee of the present application. In the architecture utilized in the Rao patent, portions of the array may be erased on a byte-by-byte basis, or in the alternative the entire array of floating gate transistors can be erased simultaneously. In the circuits disclosed in the Rao patent an erase transistor is provided for every eight floating gate memory cells, and through the application of appropriate potentials to the array, one or more of the bytes may be erased, up to a maximum of all of the bytes in the array. Although this concept and architecture works well, it will be appreciated that a substantial number of erase transistors are required to erase the entire array, which of course decreases the packing density for the memory transistors used in the array.

SUMMARY OF THE INVENTION

An object of the present invention is to provide a flash memory array which permits erasing sectors of the array without disturbing the transistors in unselected sectors.

Another object of the invention is to provide a flash memory array in which erasing the transistors in the array does not disturb the programmed and unselected transistors.

A further object of the present invention is to provide a flash memory array in which protection for the potential destructive breakdown of transistors being programmed is prevented.

In accordance with the present invention, a flash memory array is provided in which a pass gate transistor is coupled to each word line of the array and one or more word lines of the array are grouped into sectors to permit selective erase of sectors within the array. An erase select transistor is provided to selectively couple an erase voltage to the selected sector to be erased. One terminal of the erase select transistor is coupled to an erase voltage source; another terminal is coupled to the array sources of the transistors in the word lines of the selected sector, and the gate of the erase select transistor is coupled to receive on erase decode signal. This architecture permits the selective erase of one or more of the sectors of the array.

BRIEF DESCRIPTION OF THE DRAWINGS

Other objects and advantages of the invention will become apparent from a study of the specification and. drawings in which.

DETAILED DESCRIPTION OF THE INVENTION

Figure 3:
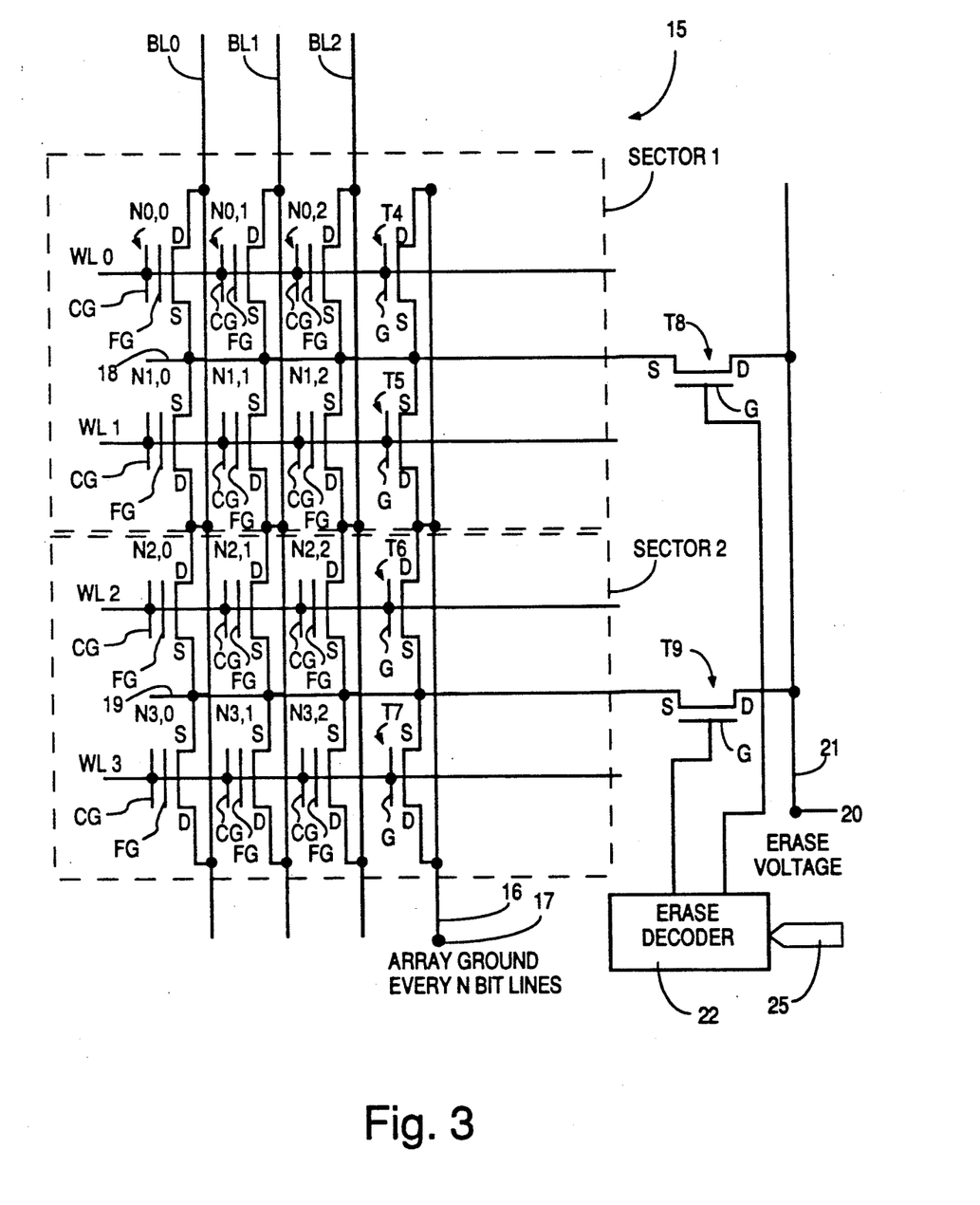
FIGS. 3 and 4 illustrate the first and second embodiments, respectively of the present invention.

The first embodiment of the present invention is illustrated in FIG. 3 wherein EEPROM flash memory array 15 is disclosed schematically. For simplicity of explanation, EEPROM flash memory array 15 is illustrated as including word lines WL0-WL3, with each of these word lines being intersected by bit lines BL0, BL1 and BL2. Included at the intersection of each of the bit lines and word lines is a flash memory transistor designated using the same convention used in FIGS. 1 and 2. For example, along word line WL0 the transistors are designated N0,0 through N0,2 are located at the intersection of word line WL0 and bit lines BL0 through BL2, respectively. Each of the transistors includes a control gate, indicated by CG, a floating gate, indicated by FG, and source and drain portions indicated by S and D, respectively. Also connected to word line WL0 is pass gate transistor T4 which has its gate (designated by a G) connected to word line WL0, its drain (indicated by D) connected via line 16 to the array ground terminal 17. The source of transistor T4 is commonly a portion of array source 18 which is shared by the transistors along word lines WL0 and WL1. The transistors along the remaining word lines are designated using above-indicated convention. Additionally, pass gate transistors T5, T6 and T7 are associated respectively with word lines WLI, WL2 and WL3. These pass gate transistors have their respective gates connected to the word line, their sources connected to either array source 18 (in the case of transistors T4 and T5), or to array source 19 (in the case of transistors T6 and T7). In EEPROM flash memory array 15, array source 18 is both physically and electrically separate from array source 19. As noted by the dashed-line blocks designated in sector 1 and sector 2, array 15 is divided for the purpose of providing section erase in which the cells in sector I, sector 2, or in both sectors may be erased in the manner which will be described below. With regard to sector 1, erase select transistor T8 is used to couple erase on voltage, which is applied to terminal 20 and supplied to the drain of erase select transistor T8 via line 21, to array source 18. The source of erase select transistor T8 is a portion of array source 18. The gate of erase select transistor T8 is connected to erase decoder 22 over line 23. The memory cells in sector 2 are erased utilizing erase select transistor T9, which has its gate connected to erase decoder 22 via line 24, and its drain connected to erase voltage terminal 20 via line 21. The source of transistor T9 is a portion of array source 19. Transistors Ts and T9 may take the general form of a field effect transistor having suitable characteristics to couple the erase voltage to array sources 18 and 19 without breakdown and has the following additional characteristics. Transistors T8 and T9 represent single level decoding. However, it will of course be appreciated by those skilled in the art that multilevel decoding would be used in practice. Erase decoder 22 receives address information over bus 25. Erase decoder may take a general form well known to those skilled in the art. As will be more fully appreciated from the explanation below, the architecture of EEPROM flash memory array 15, by utilizing pass gate transistors T4, T5, T6, T7, and erase select transistors T8 and T9, makes it possible to selectively erase one or more sectors in the array, or flash erase the entire array in a single operation cycle. Additionally, pass gate transistors T4–T7 provide advantageous characteristics to the array during programming and erase operations.

The advantages of EEPROM flash memory array 15 will be better appreciated by an explanation of the operation thereof. Table 2 below is provided to illustrate the programming, erase, and read operations for the transistors along word line WL0.

TABLE 2

Signals for Programming, Reading and Erasing EEPROM FLASH MEMORY ARRAY 15 OF FIG. 3

| Lead | Programming Transistor N0, 0 | Erasing Sector 1 | Erasing Sector 2 | Reading Transistor N0, 0 |
|---|---|---|---|---|
| WL0 | VPP+ volts | 0 | 0 | VCC (5 volts) |
| WL1 | 0 | 0 | 0 | 0 |
| WL2 | 0 | 0 | 0 | 0 |
| WL3 | 0 | 0 | 0 | 0 |
| BL0 | 6–8 volts | floating | floating | 1 volt |
| BL1 | 0 | floating | floating | 0 |
| BL2 | 0 | floating | floating | 0 |
| 23 | 0 | VPP+ volts | 0 | 0 |
| 24 | 0 | 0 | VPP+ volts | 0 |
| 21 (Erase Voltage) | 0 | VPP | VPP | 0 |
| 16 (Array Ground) | ground | ground | ground | ground |

The transistors of EEPROM flash memory array 15 are programmed using channel hot-electron injection well known to those skilled in the art. This is achieved by applying appropriate potentials to the leads as illustrated in Table 2. Taking as an example for the purpose for explanation, programming of transistor N0,0 which is accomplished by applying VPP+ to word line WLO, 6 to 8 volts to bit line BLO. Array ground over terminal 17 is always at ground potential and is coupled by a line 16 to the drains of pass gate transistors T4, T5, T6 and T7. Array ground at terminal 17 is at ground for all operations. As used herein, the term array ground indicates zero potential for the array and the return path for programming and reading current. Under the conditions set forth above, electrons travel through the gate oxide and are collected on the floating gate of transistor N0,0 to thereby program that transistor. During the program operation, it is important to note that transistor T4 is conductive and provides a low resistance path to ground terminal 17 via line 16. By utilizing pass gate transistor T4 in the programming path, array source 18 is above ground and therefore the likelihood of a destructive breakdown of transistor N0,0 during programming is reduced. In addition, pass gate transistor T4 provides the further advantage that during the programming operation of a selected transistor, the unselected transistors of the array are less likely to undergo a disturb condition. For example, during the programming operation the array source nodes of the unselected cells are floating and any leakage current flow in the unselected cells raises the unselected cell array source voltage to a small positive voltage, which lowers the voltages across the drain to source junctions of the unselected transistors, and thereby turns the transistor off. In view of this small positive voltage on the array sources of the unselected transistors (in this example array source 19), the likelihood of disturbing a programmed, unselected cell is greatly reduced. Additionally, transistor T4 (as well as pass gate transistors T5, T6 and T7 when they are involved in a program operation for transistors along their respective word lines) provides protection from the over-erase condition of unselected cells reducing the programming current. This result occurs because the unselected array sources are floating and a small positive voltage due to unwanted current flow in over-erased cells is formed on the array source lines (in this example array source 19) of those unselected transistors in sector 2, thus ensuring that the unselected transistors are nonconductive even if they are normally slightly conductive due to an over-erase condition. As will be appreciated by those skilled in the art, this is a common failure mode in flash memories where the programming operation of the selected cells in degraded because programming current is bled off by unselected cells which have been over-erased. Similarly, during reading, unselected transistors drawing current from the bit line can result in degraded reading operation. This is also a common failure mode in flash memories. It will be appreciated that transistors N0,1 and N0,2 would also be programmed by raising their respective bit lines to 6–8 volts, and maintaining the other bit lines at 0 volts.

Although a pass gate transistor (T4, T5, T6, T7) is illustrated in EEPROM flash memory array 15 for every three transistor cells, these transistors could be placed after an arbitrary number of transistor memory cells and typically would be placed every eight to sixteen cells, and there could be one pass gate transistor for every twenty-four cells. For ease of explanation, array 15 includes only three cells per word line, and thus it should not be implied that it is necessary to use a pass gate transistor for every three memory cell transistors. Preferably, the pass gate transistors should present a resistance of about three hundred ohms where the array is programmed using a program current at about one milliamp. A direct connection to ground during programming could result in destructive breakdown of the transistor being programmed.

In EEPROM flash memory array 15 the erase of the transistors is preferably accomplished using the Fowler-Nordheim tunneling of electrons from the floating gate to the source node. In EEPROM flash memory array 15 the array is structured such that the erase of the transistors may be accomplished in sectors 1 or 2. As indicated by the dashed lines these sectors, those transistors along word lines WL0 and WL1 are included in the transistors along word lines sector 1, and the transistors along word lines WL2 and WL3 are in sector 2. Table 2 includes the voltages which are applied to the various leads to accomplish the erase of the cells in sector 1 and sector 2. For example, in erasing sector 1, word lines WL0, WLI, WL2 and WL3 are all at 0 volts, bit lines BL0, BLl and BL2 are floating, and the voltage on line 23 is VPP+ volts, which is provided by erase decoder 22 based upon a command received over address bus 25. An erase voltage of VPP is provided to terminal 20 and is coupled to the drains of erase select transistors T8 and T9 over line 21. Since the gate of erase select transistor T9 is at 0 volts whereas the gate of erase select transistor T8 is at VPP+ volts, only erase select transistor T8 is conductive and the erase voltage is only provided to array source 18. Under the foregoing conditions, electrons on the floating gates of the transistors along word lines WL0 and WL1 tunnel through the gate oxide to the source side of their respective transistors, thereby erasing the programmed transistors along these word lines.

The erasure of sector 2 is accomplished by utilizing the voltages indicated in Table 2 and the operation is analogous to that used in erasing the transistors in sector 1. During the erase operation, it will be appreciated that the pass gate transistors (T4, T5, T6 and T7) serve to isolate all sectors from each other.

The erase operation permitted by the architecture of EEPROM flash memory array 15 advantageously avoids disturbing programmed transistors in the unselected sectors in contrast to the architecture utilized in flash memory array 8. It will be recalled that in the erase operation of flash memory array 8 a word line adjacent to the word line on which the transistors were being erased must be brought to a high voltage in order to provide an erase path. In contrast, in EEPROM flash memory array 15 no high voltages are applied to the cells in the unselected sectors. Therefore the potential for disturbing the programmed state of the transistors in unselective sectors is eliminated.

In flash memory arrays utilizing the technique illustrated in FIG. 3 in which a large number of sectors are utilized, it will be appreciated that providing connection directly from the gate of each of the erase select transistors to the decoder would result in a very substantial number of lines. To simplify and reduce the number of lines, multi-level decoding circuitry would be utilized to reduce the number of lines required. Multilevel decoding of the type well known to those skilled in the art would be utilized.

The read operation for EEPROM flash memory array 15 for transistor N0,0 is accomplished by providing the voltages indicated in Table 2. More particularly, word line WL0 is brought to VCC (5 volts), bit line BL0 to 1 volt, and the remaining lines and terminals are as indicated in Table 2. It will be appreciated that under these conditions pass gate transistor T4 will be conductive and provide ground for the read operation. Pass gate transistors T5, T6 and T7 will, however, be nonconductive. The read operations for transistors N0,1 and N0,2 are similarly performed with the transistor being read having one volt placed on the associated bit line and the other bit lines being at 0 volts.

Figure 4:
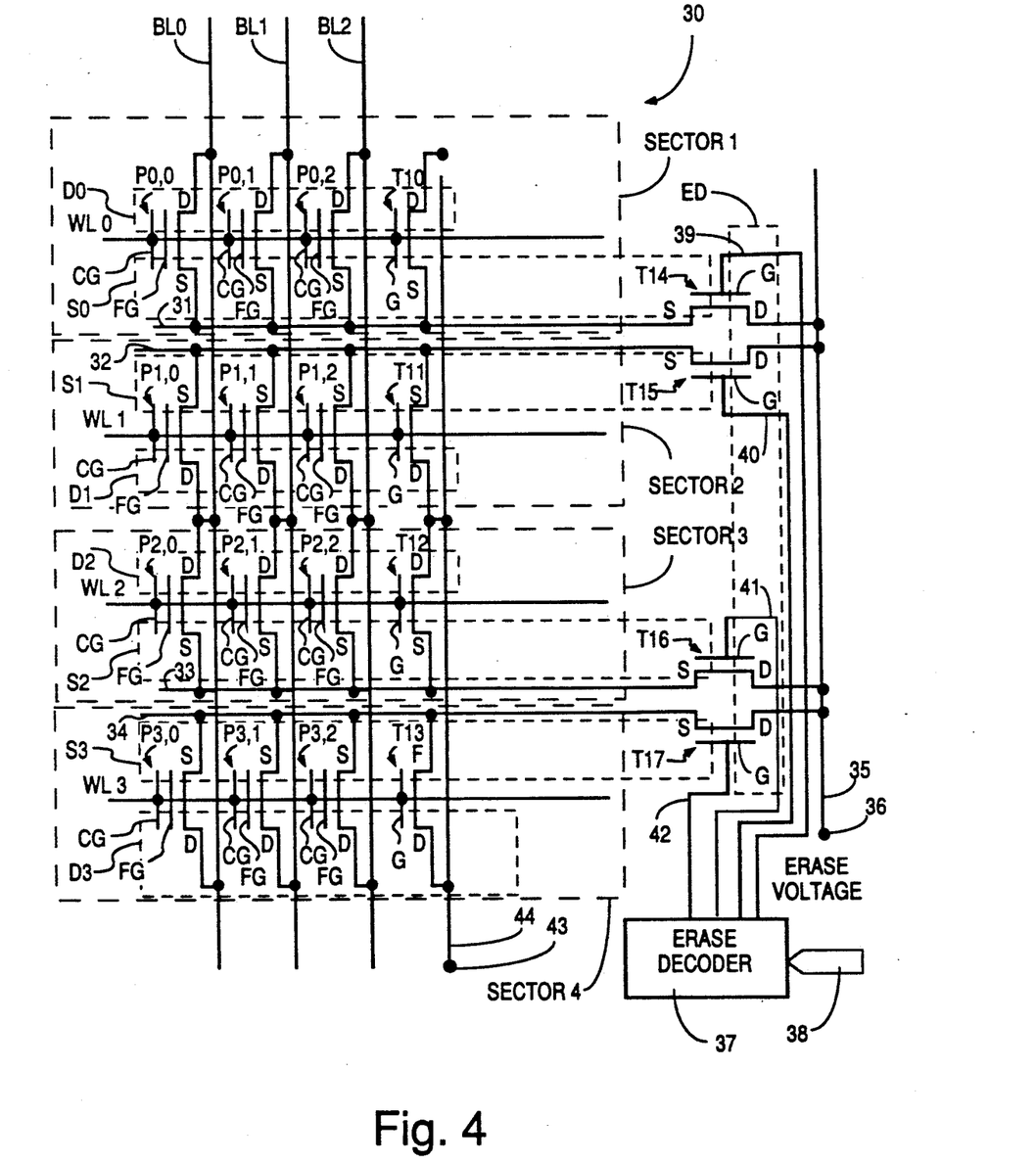

The second embodiment of the present invention is illustrated in FIG. 4 wherein EEPROM flash memory array 30 is illustrated schematically. As will be appreciated by reference to FIG. 4, the array is provided with a plurality of sectors, each of which include a single word line, in contrast to the sectors in EEPROM flash memory array 15 of FIG. 3 which included two word lines in each sector. Although only two word lines per sector are illustrated in the array of FIG. 3, it will of course be appreciated that the sectors may include an arbitrary number of word lines. The sector size would be adjusted based on the limits of the technology with respect to the effects of over-erase. The smaller the size of the sector, the less the effects of over-erase because there are fewer cells connected to the bit line which have their sources connected in common. A number of common features will be apparent by comparison of FIG. 3 and FIG. 4. For example, a pass gate transistor is provided for each word line, and more particularly, pass gate transistor T10 for word line WL0, pass gate transistor T11 for word line WLI, pass gate transistor T12 for word line WL2, and pass gate transistor T13 for word line WL3. It will be appreciated by reference to FIG. 3 that adjacent word lines in the sectors shared one array source. In contrast, in EEPROM flash memory array 30 since each sector includes a single word line, it is necessary to have a separate array source for each sector, and more particularly, array source 31 is included in sector 1, array source 32 is included in sector 2, array source 33 in sector 3, and array source 34 for sector 4. In the embodiment illustrated in FIG. 4, as well as that illustrated in FIG. 3, the array sources are both physically and electrically unconnected from each other. Erase select transistors T14, T15, T16 and T17 are provided for sectors 1, 2, 3 and 4 respectively. The drain of each of these erase select transistors is coupled to line 35 which is connected to erase voltage terminal 36. Erase decoder 37 is provided to decode the address information received over address bus 38 to provide the appropriate signal to the gate of the erase select transistor as appropriate to accomplish the erase of one or more of the sectors based on the received address information. As illustrated in FIG. 4, line 39 couples the gate of erase select transistor T14 to erase decoder 37, line 40 couples the gate of erase select transistor T15 to erase decoder 37, line 41 couples the gate of erase select transistor T16 to erase decoder 37, and line 42 couples the gate of erase select transistor T17 to erase decoder 37. It will also be appreciated that even more importantly in this embodiment than perhaps in one having a fewer number of sectors, it is desirable to provide multi-level decoding to reduce the number of lines required between the erase decoder and the gates of the erase select transistors. The operations and techniques for programming, erasing, and reading EEPROM flash memory array 30 are the same as those utilized for EEPROM flash memory array 15, with of course the exception that for array 30 erase is performed on a word-line-by-word-line basis. However, in both the FIG. 3 and the FIG. 4 embodiments, it will be of course appreciated that the entire array, or portions thereof by sector, may be erased as desired. Also provided for EEPROM flash memory array 30 is array ground terminal 43 and line 44 which couples array ground terminal 43 to the drains of each of pass gate transistors T10, T11, T12 and T13. The memory transistors utilized in EEPROM flash memory array 30 have the same characteristics as those utilized in EEPROM flash memory array 15, and similarly pass gate transistors T10, T11, T12 and T13 should have characteristics similar to pass gate transistors T4–T7 of EEPROM flash memory array 15. Additionally, erase select transistors T14, T15, T16 and T17 should have characteristics similar to those of erase select transistors T8 and T9 in of the FIG. 3 embodiment.

EEPROM flash memory array 30 is implemented preferably on a P-type substrate and includes N-type regions for the source and drain regions. To assist in appreciating and understanding the architecture for EEPROM flash memory array 30, dashed lines having drain and source indications are included within the sectors to indicate very roughly the boundaries for the various source and drain regions, as well as the boundary for the erase region indicated by reference character ED. The outline of the drain and source regions in Sector 1 are indicated by the D0 and S0 for the drain and source regions respectively. In Sector 2 the source region is indicated by S1 and the drain region by D1; in sector 3 the source region is indicated by S2 and the drain region by D2; and finally in sector 4 the source region is indicated by S3 and the drain region by D3. As will be appreciated by reference to FIG. 4, a portion of the source regions in each of the sectors functions as the source portion for the erase select transistor associated with the sector. Erase region ED is provided with erase potential over line 35, which is connected to the drain of each of the erase select transistors T14–T17. It will be further appreciated that in EEPROM flash memory array 30 each row of floating gates has an associated pair of regions (one source region and one drain region), and that for each transistor one edge of its floating gate extends above a edge of its source region and another edge of its floating gate extends above a portion the source region. It will also be noted that the gate of pass gate transistors T10 through T13 has one edge which extends above the drain region for its associated row and another edge which extends above the source region for the associated row. As is true in EEPROM flash memory array 15, the gate of the pass gate transistor in the row is formed by poly #2, and the control gates for each of the memory transistors in the rows are also formed by poly #2.

It will be appreciated that the orientation of the sectors in the embodiments of FIGS. 3 and 4 is along the word line direction, which is advantageous since inherently lower leakage currents for the programming or reading operation occur since only the cells contained within the sector will contribute to the leakage current.

Figure 5:
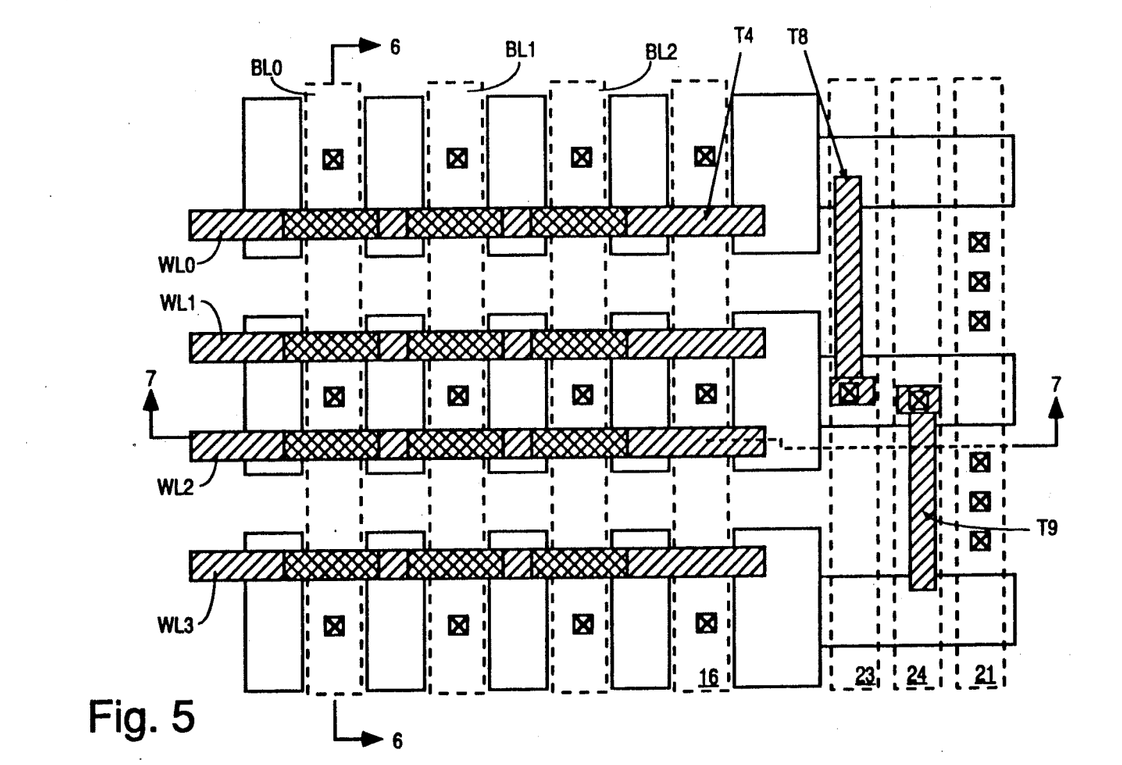
FIG. 5 illustrates in plan view an EEPROM array constructed in accordance with the embodiment of FIG. 3.
Figure 6:
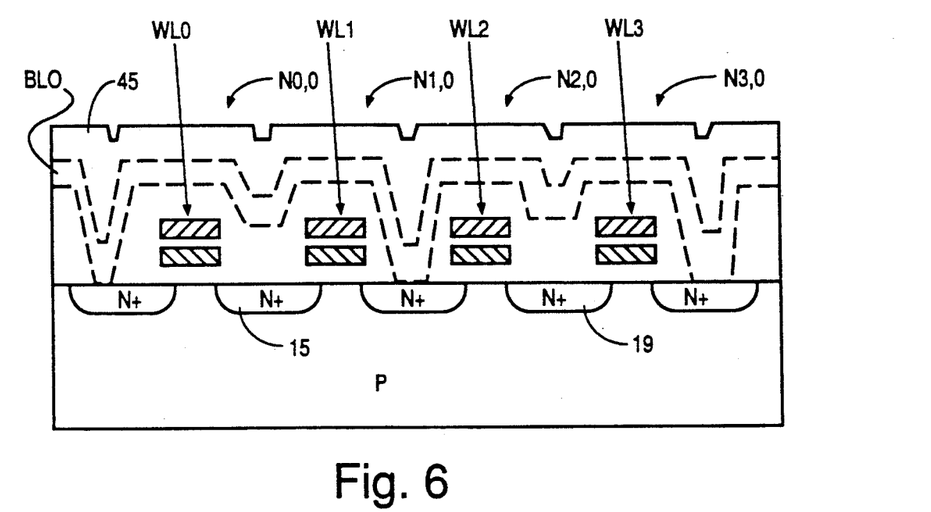
FIG. 6 illustrates in cross section portions of the array of FIG. 5 taken along line 6-6.
Figure 7:
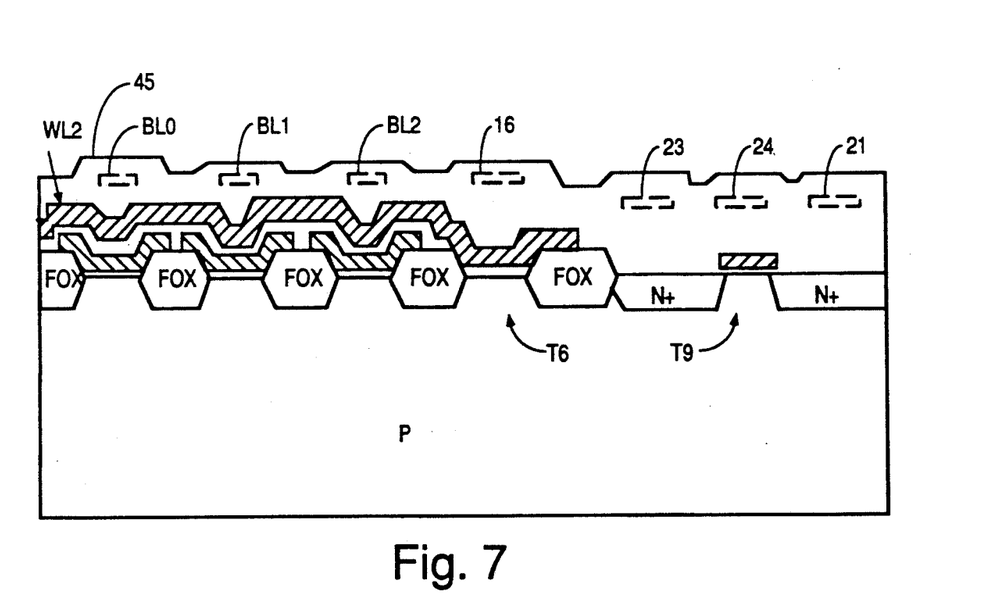
FIG. 7 illustrates in cross section portions of the array of FIG. 5 taken along line 7-7.
Figure 8:
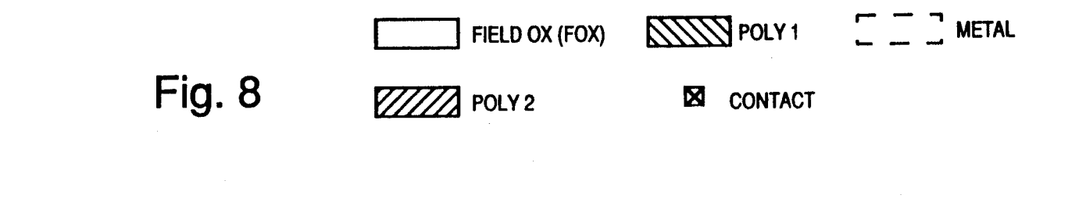
FIG. 8 illustrates the symbols used in FIGS. 5-7.

FIG. 5 is a top plan view of EEPROM flash memory array 15. FIGS. 6 and 7, taken along lines 6—6 and 7—7 respectively, illustrate EEPROM flash memory array 15 in cross-section. To assist in better understanding the drawings, a key to the symbols used in FIGS. 5–7 is provided in FIG. 8. Passivation layer 45 (FIGS. 6 and 7) provides protection to the completed array.

Various known processing techniques may be utilized in producing arrays in accordance with the present invention. Techniques such as those described in copending and commonly assigned U.S. Pat. application Ser. No. 179,196 entitled "High Density EEPROM Cell and Process for Making the Cell", filed Apr. 8, 1988, by Steve K. Hsia, et al. may be used to construct arrays in accordance with the present invention.

The foregoing illustrates two embodiments of the present invention, however, various modifications and variations from these embodiments as disclosed may be made by those skilled in the art without departing from the spirit and scope of the invention. It is of course also understood that the invention is not limited by the foregoing description and is defined only by the following claims.

We claim:
1. A circuit comprising:
a region of semiconductor material of first conductivity type;
an array of floating gates organized in rows and columns, each of said floating gates being positioned above and insulated from a surface of said region of semiconductor material; ( a plurality of control gate leads, each control gate lead being associated with one of said rows of floating and being insulated from said floating gates;
a plurality of pairs of regions of second conductivity extending to said surface of said region of semiconductor material, said pairs of regions extending in rows beneath said rows of floating gates, with one pair of said rows of regions being associated with each row of floating gates and with one region of said pair being positioned beneath one edge the floating gates of its associated row and with the other region of said pair being positioned beneath another edge of the floating gates of its associated row;
one erase region of second conductivity type extending to said surface of said region of semiconductor material and being positioned adjacent to an edge of said pairs of rows of regions of second conductivity type;
a plurality of erase gates positioned above and insulated from the surface of said semiconductor material, with one erase gate associated with each of said pairs of regions, and said erase gate associated with each pair of regions having one edge posi- tioned above a portion of said one erase region and another edge of said erase gate positioned above a portion of one of said regions of said pair of regions; and means for applying an erase potential to said erase region and means for selectively applying an erase control signal to said erase gates to thereby provide coupling of said erase potential to the region of second conductivity type associated with said erase gate.

2. A circuit according to claim 1, wherein said circuit includes a plurality of pass gates, with at least one pass gate being associated with each of said pairs of regions, with said pass gates being positioned above and insulated from said surface of said region and having one edge extending above a portion of one region of its associated pair of regions and said pass gate having another edge extending above a portion of the other region of said associated pair of regions.

3. A circuit according to claim 1, wherein said means for selectively applying erase control signals to said erase gates comprises an erase decoder having an input for receiving erase decode address information, said erase decoder further including a plurality of output lines coupled to said erase gates for providing erase control signals to said erase gates.

4. A circuit according to claim 2, wherein said means for selectively applying erase control signals to said erase gates comprises an erase decoder having an input for receiving erase decode address information, said erase decoder further including a plurality of output lines coupled to said erase gates for providing erase control signals to said erase gates.

5. A circuit comprising:
a region of semiconductor material of first conductivity type;
an array of floating gates organized in rows and columns, each of said floating gates being positioned above and insulated from a surface of said region of semiconductor material;
a plurality of control gate leads, each control gate lead being associated with one of said rows of floating and being insulated from said floating gates;
a plurality of rows of regions of second conductivity extending to said surface of said semiconductor material, said rows of regions extending substantially parallel to said rows of floating gates, wherein for predetermined pairs of rows of floating gates the region of second conductivity type positioned between the rows of the predetermined pair extends beneath a portion of the floating gates in the associated predetermined pair of rows, and wherein the other regions associated with said predetermined pairs of rows are positioned beneath an edge of the floating gates of its associated row;
one erase region of second conductivity type extending to said surface of said region of semiconductor material and being positioned adjacent to an edge of the region of second conductivity type which is shared by said predetermined pair of rows of floating gates;
an erase gate positioned above and insulated from the surface of said region of semiconductor material, with said erase gate having one edge positioned above a portion of said erase region and another edge of said erase gate positioned above a portion of said shared region; and
means for applying an erase potential to said erase region and means for selectively applying an erase control signal to said erase gate to thereby provide coupling of said erase potential to the region of second conductivity type shared by said predetermined pair of rows of floating gates.

6. A circuit according to claim 5, wherein said circuit includes a plurality of pass gates, with at least one pass gate being associated with each of said rows of floating gates with said pass gate being positioned above and insulated from said surface of said region and having one edge extending above a portion of one region associated with said row of pass gates and said pass gate having another edge extending above a portion of the other region associated with said row at pass gates.

7. A circuit according to claim 5, wherein said means for selectively applying said erase control signal to said erase gate comprises an erase decoder having an input for receiving erase decode address information, said erase decoder further including an output line coupled to said erase gate for providing erase control signals to said erase gate.

8. A circuit according to claim 6, wherein said means for selectively applying said erase control signal to said erase gate comprises an erase decoder having an input for receiving erase decode address information, said erase decoder further including an output line coupled to said erase gate for providing erase control signals to said erase gate.

* * * * *